US006574458B1

(12) United States Patent
Bargauan

(10) Patent No.: US 6,574,458 B1
(45) Date of Patent: Jun. 3, 2003

(54) METHOD FOR GENERATING A FREQUENCY-MODULATED SIGNAL WITH IMPROVED RECEIVABILITY BY A RADIO RECEIVER

(75) Inventor: Michele Bargauan, Milan (IT)

(73) Assignee: M.B. International S.r.l., Livigno (IT)

( * ) Notice: Subject to any disclaimer, the term of this patent is extended or adjusted under 35 U.S.C. 154(b) by 0 days.

(21) Appl. No.: 09/537,301

(22) Filed: Mar. 29, 2000

(30) Foreign Application Priority Data

Oct. 18, 1999 (IT) .......................................... MI99A2176

(51) Int. Cl.[7] .............................. H04B 1/00; H04B 14/00
(52) U.S. Cl. .......................... 455/114; 455/63; 455/47; 375/296; 375/242; 332/103; 381/13
(58) Field of Search ............................ 455/114, 63, 47, 455/126, 69–71; 375/296, 242; 332/103; 381/13

(56) References Cited

U.S. PATENT DOCUMENTS

| 4,223,282 A | * | 9/1980 | de Boer ...................... 332/183 |
| 4,520,498 A | * | 5/1985 | Hershberger ................ 332/151 |
| 4,550,423 A | * | 10/1985 | Naito ......................... 226/181 |
| 4,803,739 A | * | 2/1989 | Daikoku et al. ............ 375/270 |
| 5,351,016 A | * | 9/1994 | Dent ........................... 332/103 |
| 5,579,342 A | * | 11/1996 | Crozier ....................... 330/149 |
| 6,233,284 B1 | * | 5/2001 | Townshend ................. 375/242 |

* cited by examiner

Primary Examiner—Nguyen T. Vo
Assistant Examiner—Kamran Afshar
(74) Attorney, Agent, or Firm—Guido Modiano; Albert Josif; Daniel O'Byrne

(57) ABSTRACT

A method for generating a frequency-modulated signal with high receivability quality, comprising the steps of:
  before sending an input modulating signal to a modulator, modifying the input modulating signal so as to compensate for distortions which will be introduced in the modulated signal receiving section.

6 Claims, 2 Drawing Sheets

METHOD FOR GENERATING A FREQUENCY-MODULATED SIGNAL WITH IMPROVED RECEIVABILITY BY A RADIO RECEIVER

BACKGROUND OF THE INVENTION

The present invention relates to a method for generating a frequency-modulated signal having improved receivability by a radio receiver.

More particularly, the present invention relates to a method for generating a frequency-modulated signal which is particularly useful in audio transmissions and even more particularly in stereo FM transmissions.

It is known that an input signal is transmitted by modulation performed in an FM modulator which frequency-modulates the input signal.

In practice, frequency modulation is achieved by varying the instantaneous frequency of the carrier as a function of the useful information.

In the radio receiver that is meant to receive the frequency-modulated signal there are provided suitable filters which suppress the side bands of the signal, which are generated according to Bessel's theorem.

In practice, in the spectrum of an FM signal the first term of the spectrum represents the carrier, while the other terms represent the lateral components which are mutually spaced by the pulsing of the modulating wave and whose width is determined by Bessel functions.

The receiver section selects the signal to be received, filtering the received spectrum of the signal in a passband which is limited around a central frequency before frequency-demodulating the signal.

This filtering process inevitably removes some of the side bands of the received signals and this generates distortions of the signal obtained by frequency demodulation.

SUMMARY OF THE INVENTION

The aim of the present invention is to provide a method for generating a frequency-modulated signal whose receivability is higher in quality than known frequency-modulated signals.

Within the scope of this aim, an object of the present invention is to provide a method for generating a frequency-modulated signal in which the side bands are not eliminated in advance, as occurs with known frequency-modulated signals.

Another object of the present invention is to provide a method for generating a frequency-modulated signal which is suitable both for monophonic signals and for stereophonic signals.

Another object of the present invention is to provide a method for generating a frequency-modulated signal which is highly reliable, relatively easy to provide and at competitive costs.

This aim, these objects and others which will become apparent hereinafter are achieved by a method for generating a frequency-modulated signal with high receivability quality, comprising the steps of:

before sending an input modulating signal to a modulator, modifying said input modulating signal so as to compensate distortions which will be introduced in a modulated signal receiving section.

BRIEF DESCRIPTION OF THE DRAWINGS

Further characteristics and advantages of the invention will become apparent from the following detailed description of a preferred but not exclusive embodiment of the method according to the invention, illustrated only by way of non-limitative example in the accompanying drawings, wherein.

DESCRIPTION OF THE PREFERRED EMBODIMENTS

Figure 1:
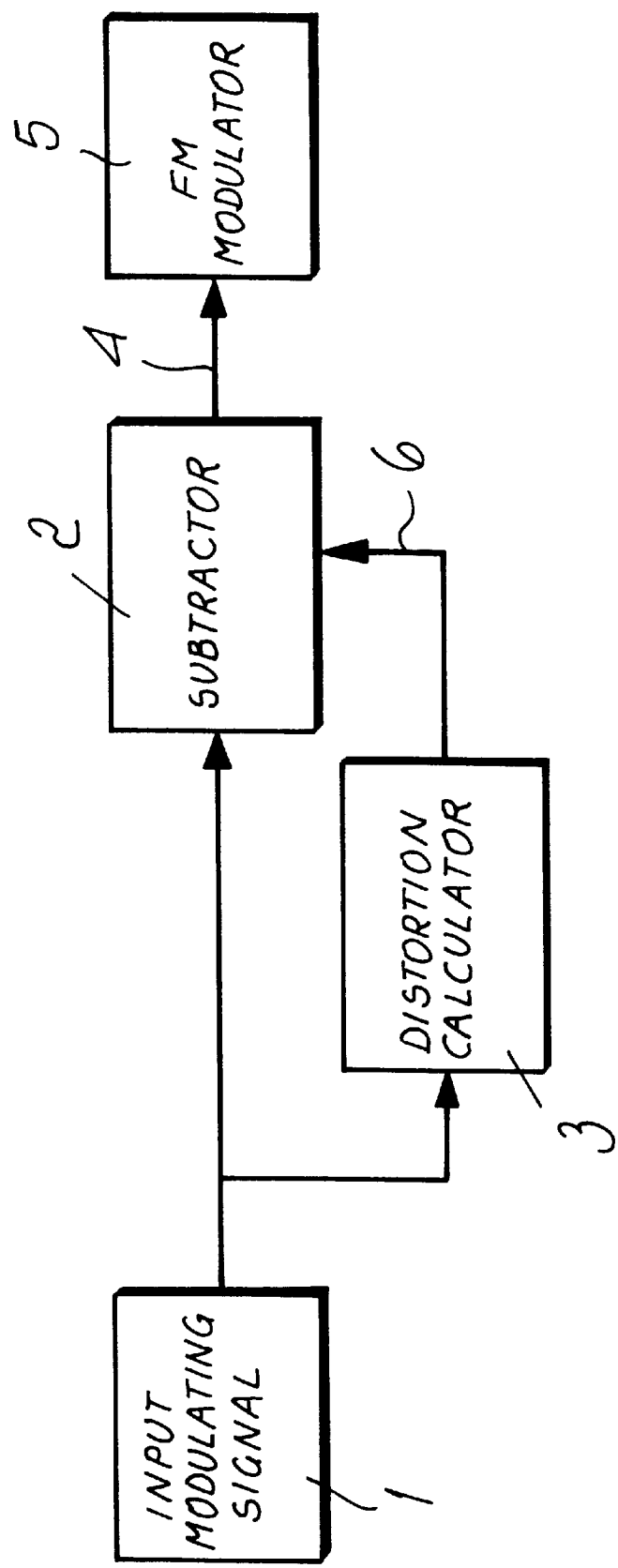
FIG. 1 is a block diagram of the method for generating a frequency-modulated signal according to the present invention.

With reference to the above figures, the method according to the invention entails, starting from an input signal 1 which can be monophonic or stereophonic, sending the signal to subtraction means 2. A calculation of the distortion, step 3, is then performed on the input signal 1, and the distortion thus calculated is subtracted from the input signal 1 in the subtraction means 2. Then the resulting signal, designated by the reference numeral 4, is sent to an FM modulator 5.

Therefore, in practice, the method according to the invention provides, before the frequency-modulation step performed by the modulator 5, the calculation of any artifacts generated in the receiving section on the received signal due to filtering; these artifacts are calculated by means of the distortion calculation step 3 and then subtracted from the input modulating signal 1.

Figure 2:
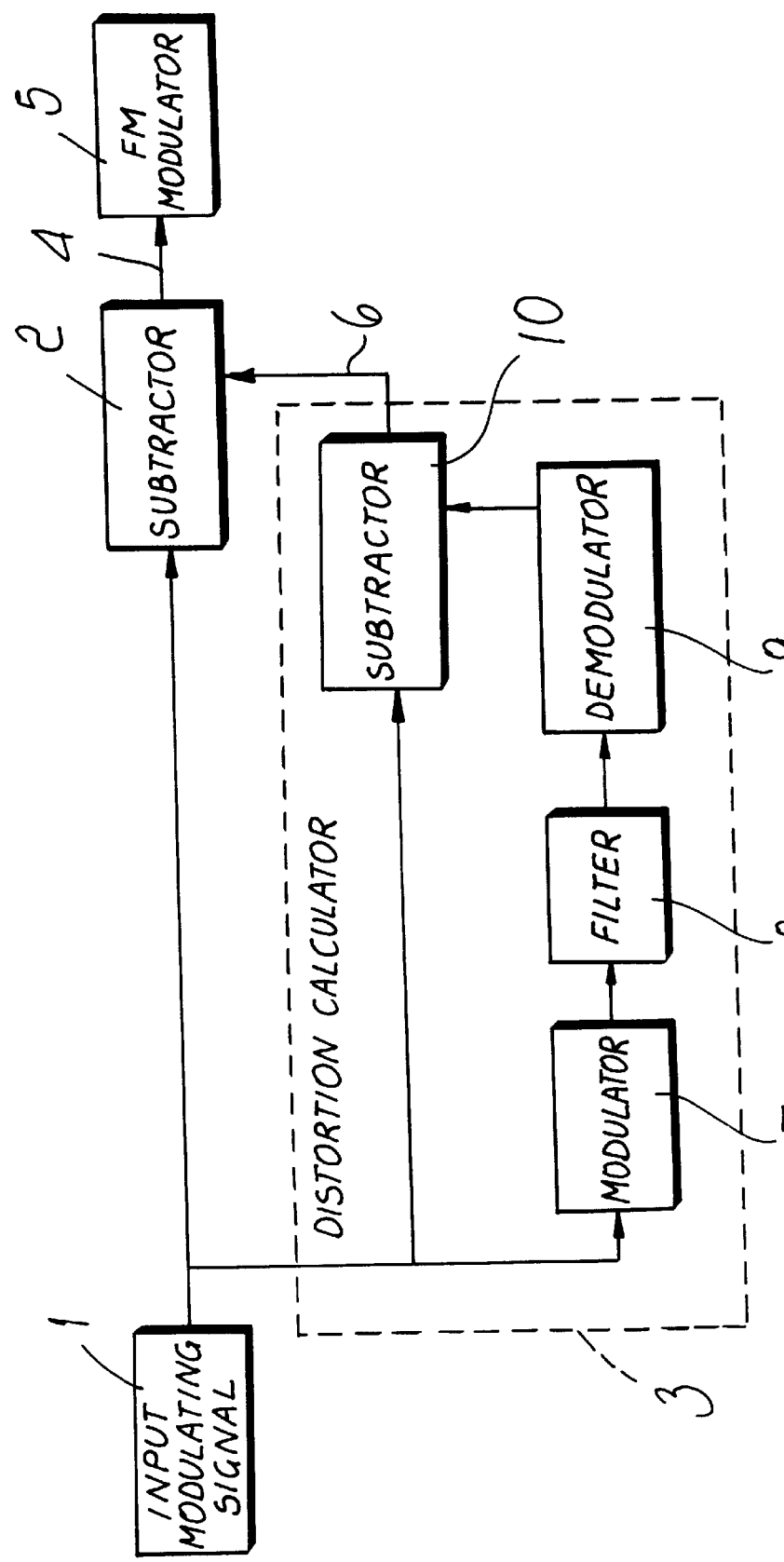
FIG. 2 is a more detailed block diagram of the method of FIG. 1.

FIG. 2 is a block diagram, similar to FIG. 1, illustrating in detail the distortion calculation step 3.

It should be noted that in both figures identical reference numerals designate identical elements.

The distortion calculation step can be performed in different manners, one of which is described hereinafter.

The input modulating signal 1 is modulated a first time in a modulator 7 with the signal that contains the information to be transmitted; it is then filtered, step 8, by means of a suitable filter of the bandpass type, which is preferably of a kind which is identical (in order to have optimum compensation) to the filter contained in the receiving section, which is meant to receive the modulated signal.

The signal output from the filter is then sent to a demodulator 9 and from there sent to subtraction means 10, which subtract the signal output from the demodulator 9 from the input modulating signal 1.

The output of the subtraction means 10, designated by the reference numeral 6, constitutes the distortion that must be subtracted in the subtraction means 2 from the input modulating signal 1.

The above-described method is particularly useful in audio transmissions, where signal linearity is very important, and particularly in stereo transmissions.

The method of transmitting stereo signals on frequency-modulated carriers, using a particular encoding regulated by standards, is known.

In the method for transmitting stereo signals, the stereo signal composed of two channels, right and left, is combined into two signals which are respectively equal to the sum and the difference of the two separate channels.

The difference signal modulates a 38-kHz subcarrier and its carrier is added to the above-described sum signal together with a reference pilot signal at 19 kHz.

The resulting signal frequency-modulates a carrier.

Since the width of the side bands of the signal is linked to the ratio between the maximum deviation and the maximum transmitted frequency (where the term "maximum deviation" designates the maximum difference between the frequency of the modulated carrier and the frequency of the unmodulated carrier), the method for encoding stereo signals generates non-negligible components at very high frequencies, above 50 kHz, with a maximum deviation of 75 kHz.

This produces significant side bands above 100 kHz and even above 150 kHz. Transmitters use a frequency spacing of 300 kHz, sometimes even 200 kHz. Accordingly, the filters of the receivers must eliminate the side bands beyond 150 kHz, sometimes above 100 kHz, thus causing considerable distortions.

With the method described above, according to the invention, the transmitter can compensate in advance for any of the above-cited distortions generated by the use of a portion of spectrum which is smaller than necessary.

In practice it has been observed that the method according to the invention allows to substantially eliminate the distortions generated during the reception of a frequency-modulated signal due to elimination of its side bands.

The method thus conceived is susceptible of numerous modifications and variations, all of which are within the scope of the inventive concept; all the details may furthermore be replaced with other technically equivalent elements.

The disclosures in Italian Patent Application No. MI99A002176 from which this application claims priority are incorporated herein by reference.

What is claimed is:

1. A method for generating a frequency-modulated signal with high receivability quality, comprising the steps of:

before sending an input modulating signal to a modulator, modifying said input modulating signal so as to compensate for distortions which will be introduced in a modulated signal receiving section, wherein the step of modifying said input modulating signal in order to compensate for said distortions comprises the steps of:

calculating, starting from said input modulating signal, distortions which will be introduced in said receiving section; and wherein the step of calculating said distortions comprises the steps of:

modulating said input modulating signal in a modulator with a useful information signal to be transmitted, so as to obtain a modulated signal;

filtering the modulated signal output from said modulator;

demodulating the modulated signal after said filtering step; and subtracting the demodulated signal from the input modulating signal, in order to obtain a signal which is representative of said distortions and is suitable to be subtracted from said input modulating signal.

2. The method of claim 1, further comprising the step of subtracting said calculated distortions from said input modulating signal.

3. The method of claim 1, wherein the step of filtering the signal output from said modulator is performed by filtering means in order to compensate for said distortions at least partially.

4. The method of claim 3, wherein the characteristics of said filtering means are identical to those of filtering means included in said receiving section in order to provide optimum compensation of said distortions.

5. The method according to claim 1, wherein it is used for a monophonic audio signal.

6. The method of claim 1, wherein it is used for a stereophonic audio signal.

* * * * *